US008154557B2

(12) United States Patent
Anai

(10) Patent No.: US 8,154,557 B2
(45) Date of Patent: Apr. 10, 2012

(54) FLAT-PANEL DISPLAY DEVICE

(75) Inventor: Kimio Anai, Fukaya (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 693 days.

(21) Appl. No.: 12/331,114

(22) Filed: Dec. 9, 2008

(65) Prior Publication Data

US 2009/0153583 A1 Jun. 18, 2009

(30) Foreign Application Priority Data

Dec. 17, 2007 (JP) ................................ 2007-325014

(51) Int. Cl.

| | |
|---|---|
| ***G09G 5/00*** | (2006.01) |
| ***G09G 5/02*** | (2006.01) |
| ***G09G 5/10*** | (2006.01) |
| ***G06K 9/40*** | (2006.01) |
| ***G06K 9/00*** | (2006.01) |
| ***H04N 11/02*** | (2006.01) |
| ***H04N 5/66*** | (2006.01) |
| *G06K 9/32* | (2006.01) |
| *H03L 7/00* | (2006.01) |
| *H04N 9/12* | (2006.01) |

(52) U.S. Cl. ........ 345/589; 345/581; 345/606; 345/690; 348/405.1; 348/538; 348/739; 382/300; 382/162; 382/254; 382/274

(58) Field of Classification Search .................. 345/581, 345/589, 643–644, 657, 606, 619, 204, 690–691, 345/696; 348/401.1, 427.1, 430.1, 405.1, 348/440.1, 503, 536–538, 550, 739; 382/162, 382/167, 254, 274, 293–300

See application file for complete search history.

(56) References Cited

U.S. PATENT DOCUMENTS

| | | | | |
|---|---|---|---|---|
| 6,437,793 | B1 * | 8/2002 | Kaasila | 345/611 |
| 2006/0066513 | A1 | 3/2006 | Anai | |
| 2006/0197778 | A1 * | 9/2006 | Peterson et al. | 345/611 |
| 2009/0003730 | A1 * | 1/2009 | Pande et al. | 382/298 |
| 2009/0033792 | A1 * | 2/2009 | Kano et al. | 348/441 |

FOREIGN PATENT DOCUMENTS

| | | |
|---|---|---|
| JP | 2003-259386 | 9/2003 |

* cited by examiner

*Primary Examiner* — Wesner Sajous
(74) *Attorney, Agent, or Firm* — Finnegan, Henderson, Farabow, Garrett & Dunner, L.L.P.

(57) ABSTRACT

According to an embodiment of the invention, even if a sample-and-hold circuit samples a signal from a signal processor to a display unit, an image quality reduction is hard to occur. According to an embodiment of the invention, there is provided a flat-panel display device includes a phase control circuit setting a state that a first parallel arrangement RGB pixel signal shifts by 120 degrees, a sample-and-hold circuit sampling a second parallel arrangement RGB pixel signal parallel-output from the phase control circuit to obtain a series arrangement RGB pixel signal, which is three times as much as a single pixel signal, and a driver supplying the series arrangement RGB pixel signal to the corresponding display pixel.

8 Claims, 11 Drawing Sheets

FLAT-PANEL DISPLAY DEVICE

CROSS-REFERENCE TO RELATED APPLICATIONS

This application is based upon and claims the benefit of priority from prior Japanese Patent Application No. 2007-325014, filed Dec. 17, 2007, the entire contents of which are incorporated herein by reference.

BACKGROUND OF THE INVENTION

1. Field of the Invention

One embodiment of the invention relates to a flat-panel display device. For example, the flat-panel display device is preferably applied to a liquid crystal display device.

2. Description of the Related Art

A conventional liquid crystal display device has the following configuration. Specifically, a signal processor converts a Y/U/V digital video signal to R, G and B color video signals. Thereafter, a digital-to-analog converter converts each of these R, G and B color video signals into an analog signal, and then, supplies the analog signal to a display unit. In this case, R, G and B analog signals output from the signal processor are sampled once by a sample-and-hold circuit built into a source driver of the display unit. When a signal for one horizontal line is sampled, the sample signals are supplied all together to a horizontal line pixel designated by a gate driver via a gate circuit.

Recently, the limited lifetime of energy resources and conservation of the natural environment have attracted the world's attention. In view of such circumstances, there is a need to promote energy saving and power saving in electronic apparatuses. In order to achieve power saving of a flat-panel display device, there has been proposed a method of reducing the number of pixels driven in one video frame, for example. However, this is a factor of reducing image quality depending on a selected mode of a driven pixel.

Conversely, in order to prevent a reduction of the image quality, various techniques have been conventionally proposed (e.g., see Jpn. Pat. Appln. KOAKI Publication No. 2003-259386).

In the display device, the digital-to-analog converter and the sample-and-hold circuit usually operates in synchronism with each other. However, there is the case where a processing for converting the number of pixels is carried out to reduce the number of pixels of the input signal. The foregoing processing for converting the number of pixels has the following purposes. One is a purpose for aligning the number of pixels of the input signal with the number of pixels of the display itself. Another is a purpose for achieving the foregoing power saving. In such a case, a signal output from the digital-to-analog converter is not always sampled by the sample-and-hold circuit at a suitable timing. For example, in the display unit formed using polysilicon, a sample phase shifts from a predetermined phase position resulting from non-uniformity of products.

In this case, each of corresponding RGB pixel signals are not always supplied accurately to each of RGB display pixels forming one color pixel of the display unit. If the corresponding RGB pixel signals are not accurately supplied to the RGB display pixels, quality reduction and change color occurs.

In addition, if a shift exists in the sample phase, a sample point position sampling and holding a pixel signal is variously varied with respect to a change point of the pixel signal output from the digital-to-analog converter (switching position of pixel signal). As described above, the sample point position of the pixel signal is variously varied with respect to a change point of the pixel signal, and thereby, an influence of carrier component appears. The influence of carrier component is a factor of generating a noise component; as a result, an image quality is reduced.

In addition, if a sampling frequency is high and an amount of write of the pixel signal to the display unit is much, a driver for driving the display unit has high load, and power consumption increases.

BRIEF SUMMARY OF THE INVENTION

An object of the embodiments of the present invention is to provide a fat-panel display device, which can prevent a reduction o an image quality, and reduce a load of a driver and power consumption even if a sample-and-hold circuit samples a signal supplied from a signal processor to a display unit.

According to one aspect of the present invention, there is provided a flat-panel display device comprising:

a phase control circuit setting a state that a first parallel arrangement RGB pixel signal shifts by 120 degrees;

a sample-and-hold circuit sampling a second parallel arrangement RGB pixel signal parallel-output from the phase control circuit to obtain a series arrangement RGB pixel signal, which is three times as much as a single pixel signal; and a driver supplying the series arrangement RGB pixel signal to the corresponding display pixel.

According to another aspect of the present invention, there is provided the device wherein the display area driver supplies the series arrangement RGB pixel signal to the corresponding display pixel, the driver setting some pairs of RG pixel signal, BR pixel signal, GB pixel signal, RG pixel signal, BR pixel signal, GB pixel signal, . . . when supplying the series arrangement RGB pixel signal to the corresponding display pixel, and supplies one pixel signal of each pair to the corresponding display pixel in an n frame while supplies the other pixel signal of each pair to the corresponding display pixel in a (n+1) frame.

Additional objects and advantages of the embodiments will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Various embodiments according to the invention will be described hereinafter with reference to the accompanying drawings.

Figure 1:
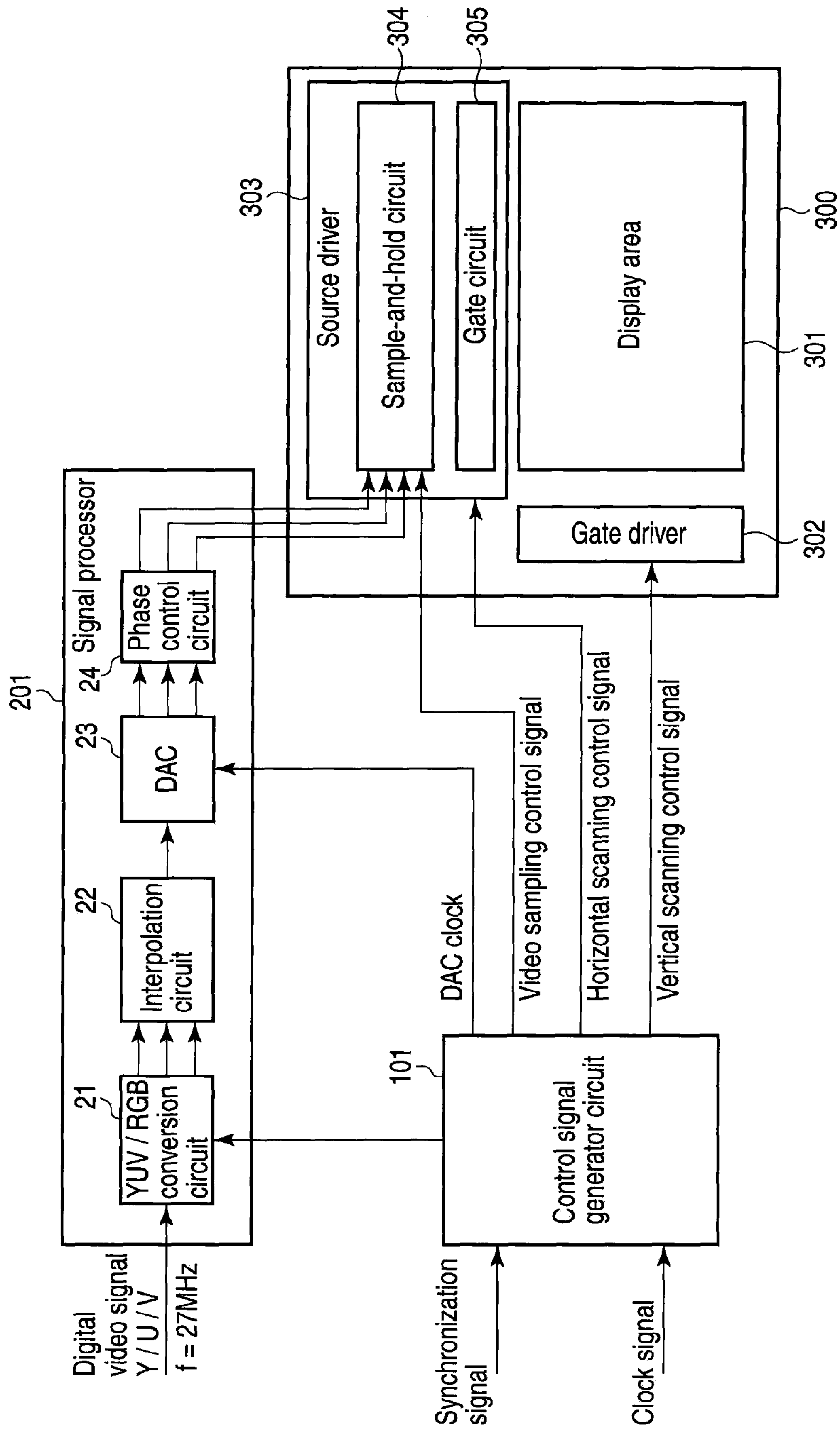
FIG. 1 is a block diagram showing the configuration of a flat-panel display device according to one embodiment of the invention.

The embodiment of the invention will be described hereinafter with reference to the accompanying drawings. FIG. 1 is a block diagram showing the configuration of a flat-panel display device according to one embodiment of the invention.

A technique of preventing a reduction of an image quality will be described with reference to FIGS. 1 to 4. A power/energy saving technique will be described with reference to FIGS. 5 and 6.

A Y (luminance)/U (color difference)/V (color difference) digital video signal transferred at a first frequency (f=27 MHz) is input to a YUV/RGB conversion circuit 21 of a signal processor 201. The YUV/RGB conversion circuit 21 converts once the series-input YUV signal to a parallel YUV signal transferred at a second frequency (f/4). The circuit 21 further operates the YUV signal to obtain a parallel RGB signal.

The parallel RGB signal is input to an interpolation circuit 22. The interpolation circuit 22 generates an interpolation signal, and then, supplies the parallel RGB signal and the interpolation signal to a digital-to-analog converter (DAC) 23. The DAC 23 converts each of the RGB signals to an analog signal, and then, supplies them to a phase control circuit 24. The phase control circuit 24 controls the phase of RGB pixel signals (described later in detail), and then, supplies them to the corresponding sample-and-hold circuit 304 included in a source driver 303. An output of the sample-and-hold circuit 304 is supplied to a display area 301 via a gate circuit 305.

A display unit 300 has a source driver 303 forming a display region driver and a gate driver 302. The source driver 303 and the gate driver 302 give a pixel signal to two-dimensionally arrayed pixels in the display area 301.

When the sample-and-hold circuit 304 samples one horizontal period signal, the sampled signal is collectively supplied to a pixel on a horizontal line designated by the gate driver 302.

Reference number 101 denotes a control signal generator circuit. The control signal generator circuit 101 generates various timing signals based on a synchronization signal and a clock signal. Specifically, a clock signal for the DAC 23, a sampling control signal for the sample-and-hold circuit 304, a horizontal scanning signal for the gate circuit 305 and a vertical scanning control signal for the gate driver 302 are generated.

In the foregoing device, the DAC 23 may be replaced with the phase control circuit 24 in its arrangement. In other words, the phase control circuit 24 controls the phase of the RGB pixel signals output from the interpolation circuit 22. Thereafter, the DAC 23 converts the output of the phase control circuit 24 to an analog signal.

Figure 2:
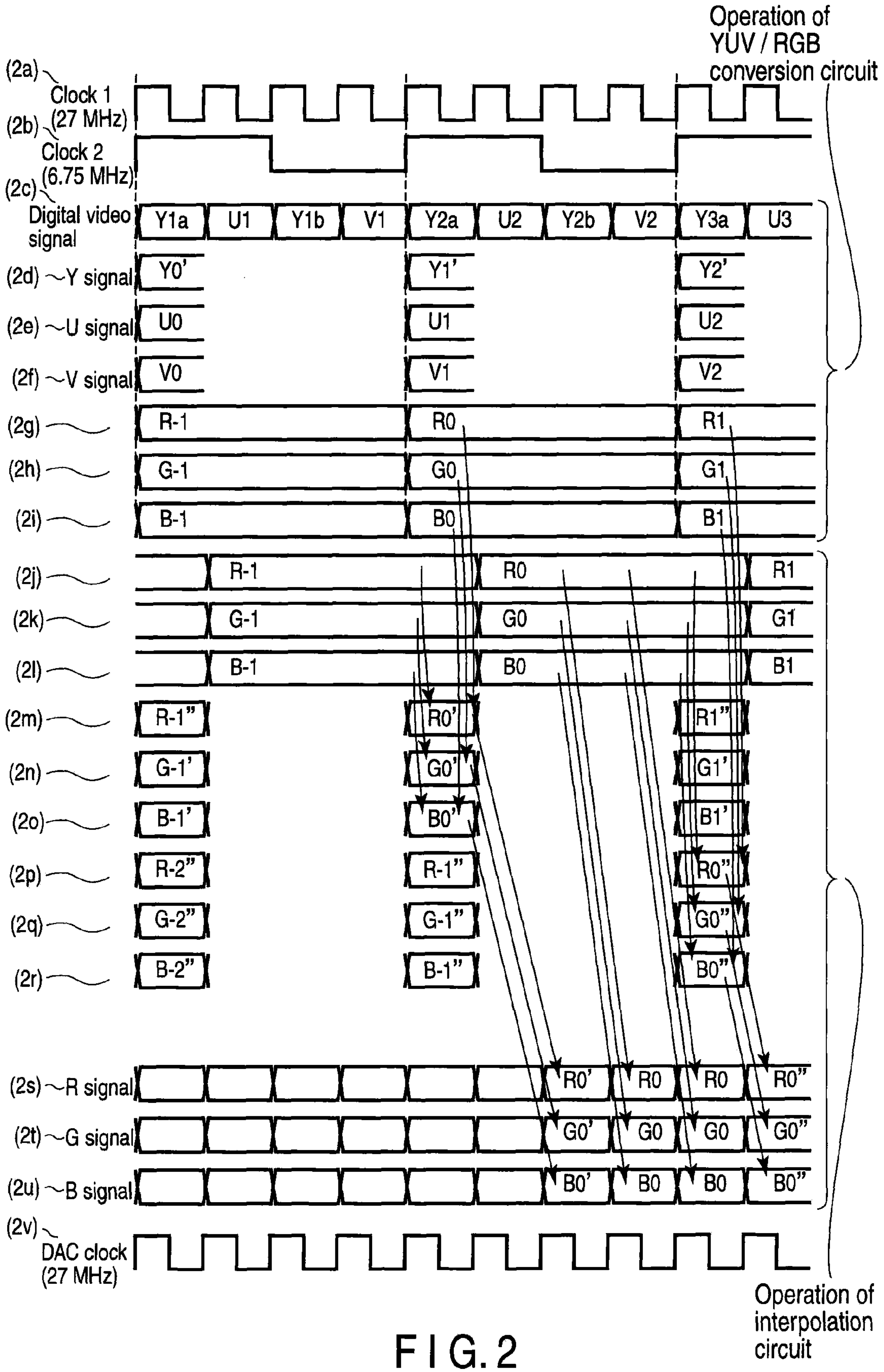
FIG. 2 is a timing chart to explain an interpolation operation and an analog conversion of pixel data in the device shown in FIG. 1.

The operation of the interpolation circuit 22 will be described below with reference to FIG. 2. In FIG. 2, a symbol (2*a*) position signal is a first frequency (f=27 MHz) clock. A series of YUV digital video signals is transferred at the foregoing clock rate. In FIG. 2, Y1*a*, U1, Y1*b*, V1, Y2*a*, U2, Y2*b*, V2, . . . are shown at a symbol (2*c*) position. The YUV digital video signal is converted once to a parallel YUV signal as shown in symbols (2*d*), (2*e*) and 2(*f*). The YUV digital video signal is a second frequency ((f/4)=6.75 MHz) clock (see symbol (2*b*) position). An operation using the parallel YUV signal is carried out, and thereby, a parallel RGB signal is generated. As seen from symbol (2*g*), (2*h*) and (2*i*) positions, an R series is shown as R−1, R0, R1, . . . , a G series is shown as G−1, G0, G1, . . . , and a B series is shown as B−1, B0, B1, . . . . These parallel RGB signals are delayed by the first frequency, that is, by a one-clock delay circuit to carry out an interpolation operation (see symbol (2*j*), (2*k*) and (2*l*) positions in FIG. 2).

The generated interpolation signals are shown at symbol (2*m*), (2*n*) and (2*o*) positions using symbol (2*g*), (2*h*) and (2*i*) position signals and symbol (2*j*), (2*k*) and (2*l*) position signals in FIG. 2. These (2*m*), (2*n*) and (2*o*) position signals are generated from the following equation.

$$N' = a \times (N-1) + b \times N$$

where, N is Nth R, G an B, and a and b are different coefficient.

The generated signals are further shown at symbol (2*p*), (2*q*) and (2*r*) positions using symbol (2*g*), (2*h*) and (2*i*) position signals and symbol (2*j*), (2*k*) and (2*l*) position signals in FIG. 2. These (2*p*), (2*q*) and (2*r*) position signals are generated from the following equation.

$$N'' = c \times N + d \times (N+1)$$

where, N is Nth R, G an B, and c and d are different coefficient.

The foregoing parallel RGB signals are arranged in the time axis at the first frequency rate. This state is shown as symbol (2*s*), (2*t*) and (2*u*) position in FIG. 2.

According to the arrangement, if the parallel RGB signal is set as a first intermediate parallel RGB signal (e.g., R0, G0, B0), interpolation is made so that a second intermediate parallel RGB signals (e.g., R0, G0, B0) having the same content are arranged adjacent to the first parallel intermediate RGB signal in the time axis direction. A front parallel RGB signal (R0', G0', B0') and a rear parallel RGB signal (R0", G0", B0") generated by the interpolation are arranged before and after the first and second intermediate parallel RGB signals. Such an arrangement generates a so-called over sampling, and a sampling clock is the same as the first frequency as seen from (2*v*) in FIG. 2. However, a pixel change changes at the second frequency. The frequency is given as the second frequency (f/4)=6.75 MHz when a=d=0, b=c=1. If the condition different from the foregoing condition is given, different frequency is given.

The foregoing parallel RGB signal is supplied to the DAC 23 so that each of RGB signals is concurrently converted to an analog signal, and then, input to the corresponding sample-and-hold circuit 304.

Figure 3:
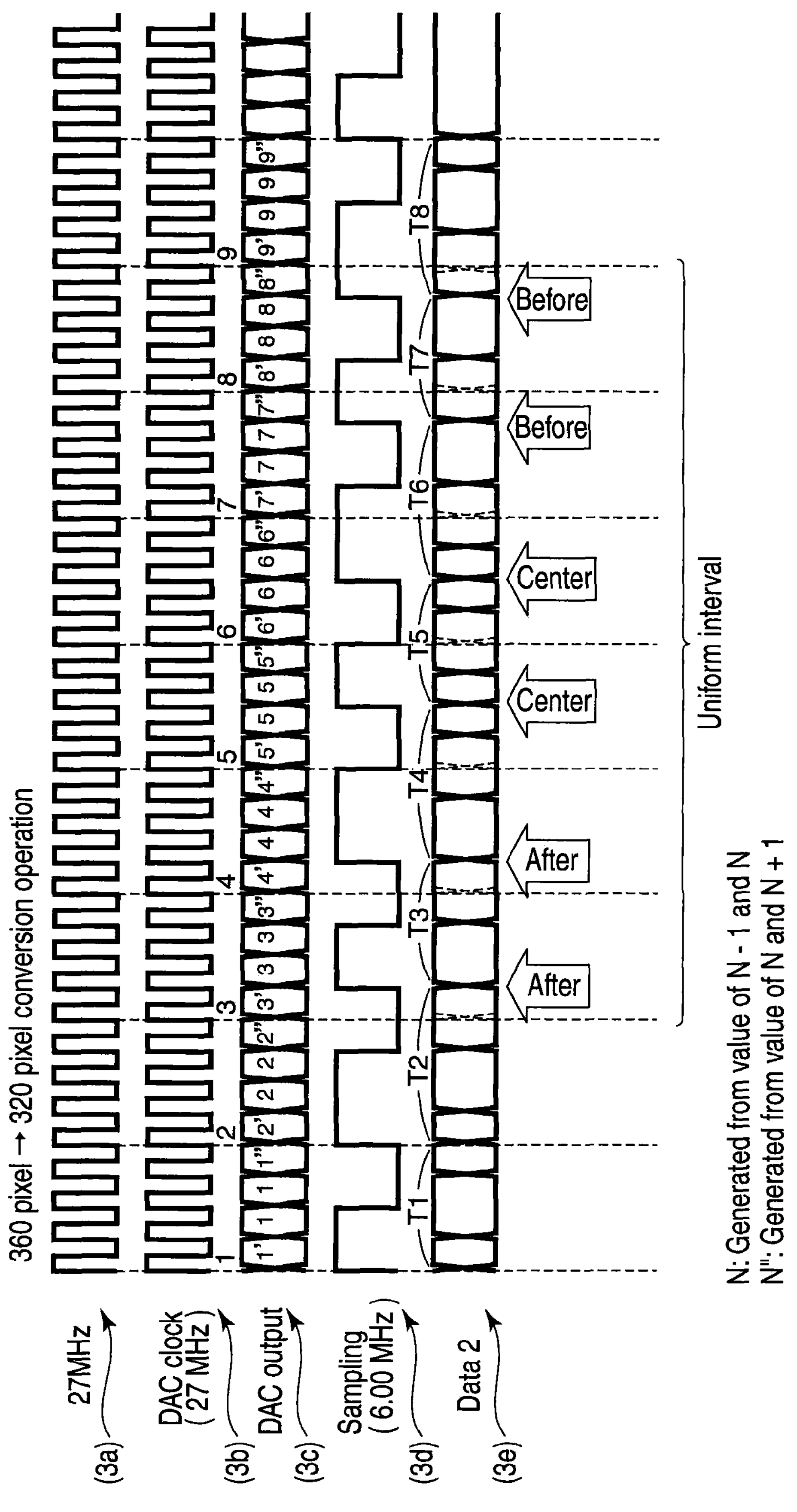
FIG. 3 is a timing chart to explain a sampling operation in the device shown in FIG. 1.

FIG. 3 shows a timing when the output from the DAC 23 is controlled in its phase by the phase control circuit 24, and thereafter, held by the sample-and-hold circuit 304. According to the timing, a sampling frequency of the sample-and-hold circuit 304 is selected, and thereby, 360-pixel input is converted to 320 pixels.

In the phase control circuit 24, the phase of a RGB pixel signal (first parallel RGB pixel signal or data) is shifted by 120 degrees.

In FIG. 3, a symbol (3*a*) position signal is a first frequency clock. A symbol (3*b*) position signal is the same first frequency, and is a conversion clock of the DAC 23. As a result, the analog conversion output is shown in a divided state at a symbol (3*c*) position in FIG. 3. Actually, the carrier component is an analog output.

The analog output exists in a state that RGB, that is, three series exist in parallel. In FIG. 3, typically, one series is shown. For example, '1', 1, 1, 1"', '2', 2, 2, 2"' and '3', 3, 3, 3"' correspond to "R−1', R−1, R−1, R−1"', "R0', R0, R0, R0"' "R+1', R+1, R+1, R+1"', . . . .

In FIG. 3, a symbol (3*d*) position signal is a sampling clock. The sample-and-hold circuit 304 samples an input analog signal according to the sampling clock. Data is sampled while the clock rises. In FIG. 3, a symbol (3*e*) shows the state of the sampled data. Here, considering a change point of the pixel signal and the sampling time, the sampling point coincides with the pixel change point in periods T1 and T2. In period T3, a sampling point exists after a pixel change point (change point from 2 to 3). In period T4, a sampling point exists after a pixel change point (change point from 3 to 4). In period T5, a sampling point exists on the center of a pixel change point (between change points from 4 to 5 and from 5 to 6). In period T6, a sampling point exists on the center of a pixel change point (between change points from 5 to 6 and from 6 to 7).

According to the foregoing analog conversion and sampling method, the first frequency clock of data, that is, carrier is approximately uniformly distributed between the pixel signals. In other words, signal sampling is carried out at approximately uniform interval in the time axis direction. Thus, an influence of carrier is uniformly given to the pixel signal, and therefore, the influence of carrier is not biased. In addition, the carrier is a high-frequency component. Therefore, the carrier is bypassed by capacity, and thus, attenuated in the sample-and-hold circuit 304. As a result, the pixel signal is stably supplied to each pixel; therefore, reduction of an image quality can be prevented.

The relationship between the phase control circuit 24, the sample-and-hold circuit 304 and a display pixel arrangement on the display area 301 will be described below with reference to FIG. 4.

Figure 4:
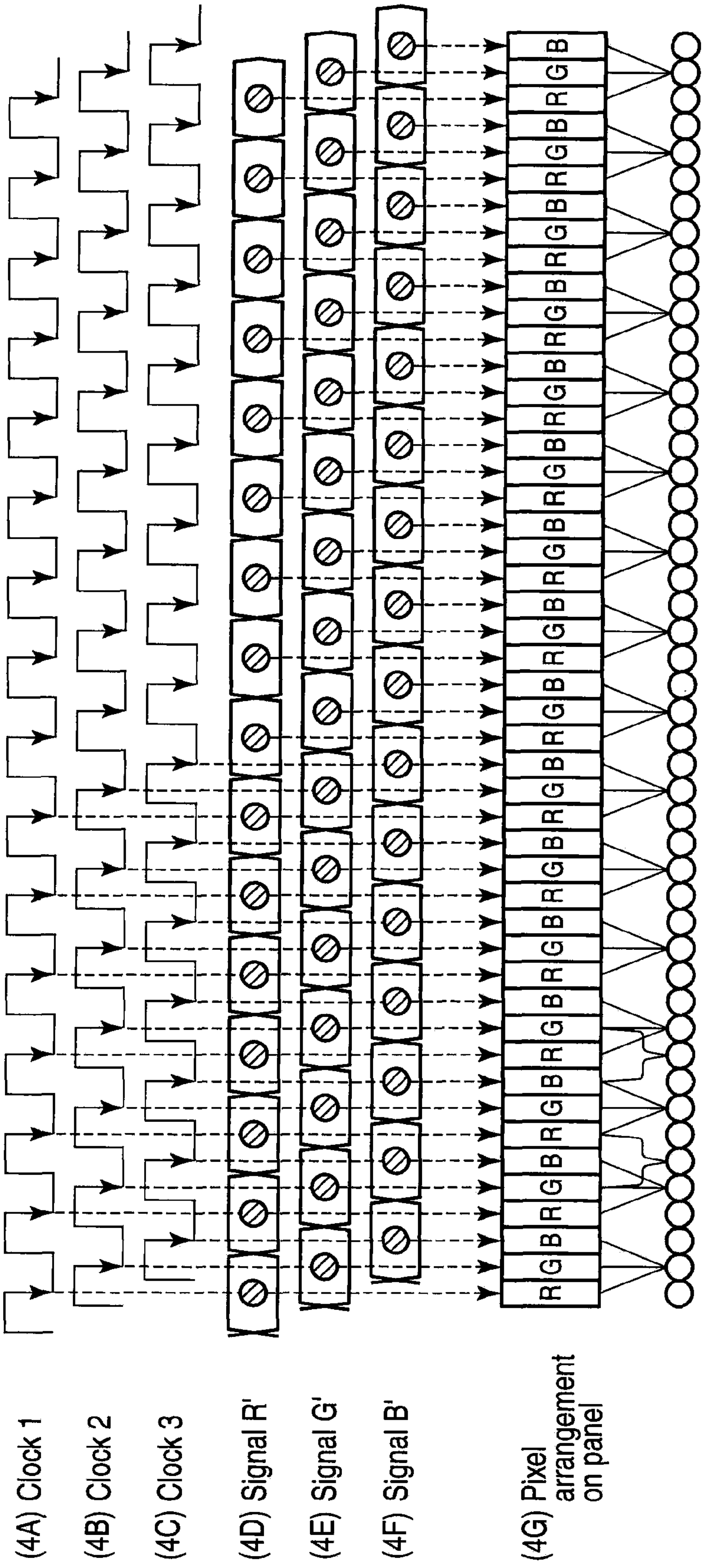
FIG. 4 is a view showing phase control of RGB pixel signals and sample-and-hold timing in the device shown in FIG. 1.

In FIG. 4, symbol (4A), (4B) and (4C) position signals are a clock for sampling R, G and B pixel signals, respectively. In FIG. 4, symbol (4D), (4E) and (4F) position signals are RGB pixel signals output from the phase control circuit 24. In FIG. 4, a divided state is shown based on the clock; however, the signal is actually an analog signal; therefore, it is continuous.

The phase control circuit 24 sets a state that the phase of a first parallel arrangement RGB pixel signal output from the DAC 23 is shifted by 120 degrees to obtain a second parallel arrangement RGB pixel signal parallel output. The sample-and-hold circuit 304 samples the second parallel arrangement RGB pixel signal to obtain a series arrangement RGB pixel signal. The number of arrangements of the series arrangement RGB pixel signal is three times as much as the number of arrangement of a single pixel signal. The sampled state corresponds to a horizontal arrangement of display pixels on the panel as shown by a symbol (4G).

As described above, when the phase of the RGB signal is controlled and sampled, even if any of couples of RGB, GRB and BRG displays a color display pixel, the original color image is reproduced.

In the device, a display area driver composed of the gate driver 302 and source driver 303 employs the following method when supplying the series arrangement RGB pixel signal to the corresponding display pixel via the gate circuit 305 from the sample-and-hold circuit 304. Specifically, the driver sets some pairs of RG pixel signal, BR pixel signal, GB pixel signal, RG pixel signal, BR pixel signal, GB pixel signal, . . . . Then, the driver supplies one pixel signal of each pair to the corresponding display pixel in an n frame, and supplies the other pixel signal of each pair to the corresponding display pixel in a (n+1) frame.

Figure 5:
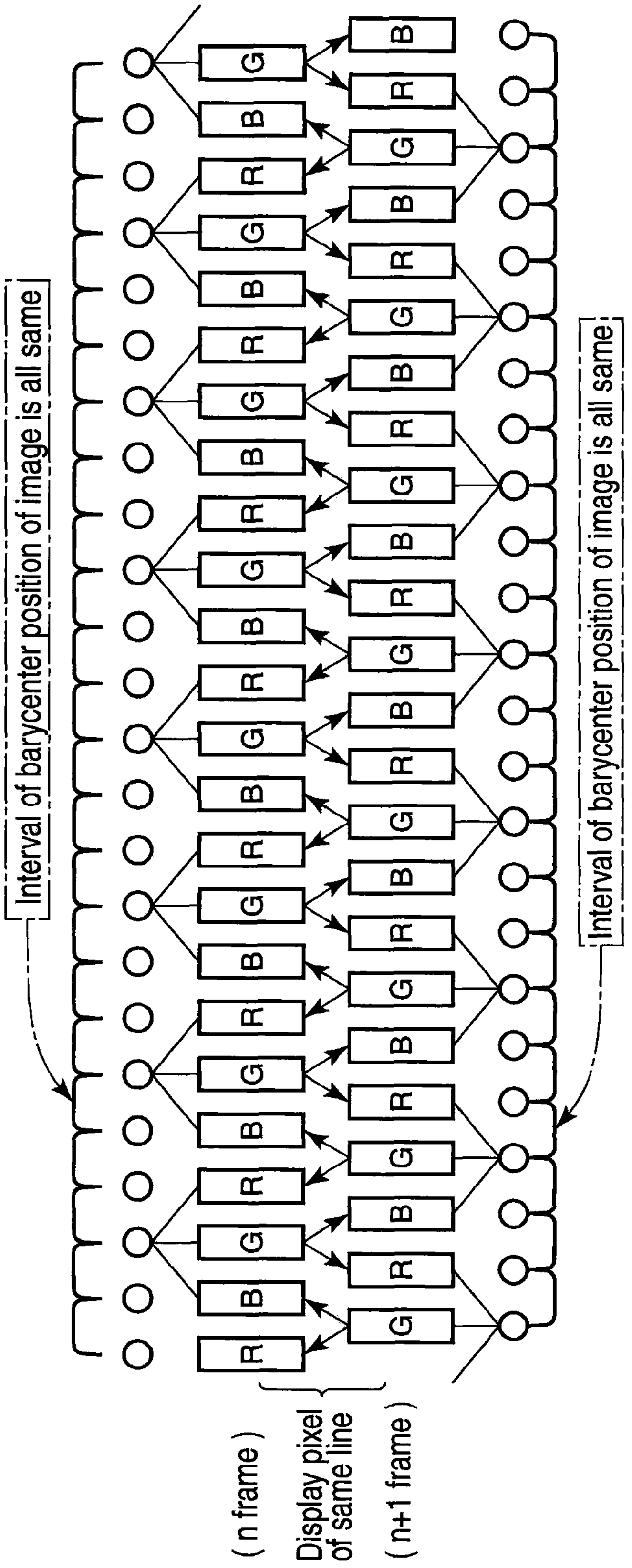
FIG. 5 is a view to explain a drive mode of the device shown in FIG. 1.

In FIG. 5, there are shown a RGB display pixel when the pixel signal is supplied in an n (n is an integer) frame and a RGB display pixel when the pixel signal is supplied in an (n+1) frame. This drive is realized by a pixel signal selection processing by the gate circuit 305. Even if such a power drive performing power saving is carried out, the phase control circuit 24 is provided, and the foregoing sampling hold is carried out. Thus, display is realized without reducing the quality of color pixels.

The operation of the phase control circuit 24 and the sample-and-hold circuit 304 prevents bias of barycenter position of the color pixel and disturbance of the barycenter position. In FIG. 5, as shown by white circles, the interval of the barycenter position of the color pixel is the same. Therefore, even if the foregoing drive method (two-frame cyclic type) is employed to reduce a load of the driver and power consumption, the image quality and the color quality are not reduced.

As described above, according to the invention, the following problem is solved. Namely, the sampling interval of the RGB pixel signal is unstable and irregular; for this reason, the quality as the color pixel is reduced. In order to obtain the effect of preventing the quality reduction, means for setting the sampling interval of the same pixel signal to a fixed interval has been described in FIGS. 2 and 3. In FIGS. 4 and 5, phase control between RGB pixel signals and sample-and-hold processing means have been described. In addition, the two-frame cyclic type drive method has been described to obtain low power consumption and operation load reduction of the driver.

Figure 6C:
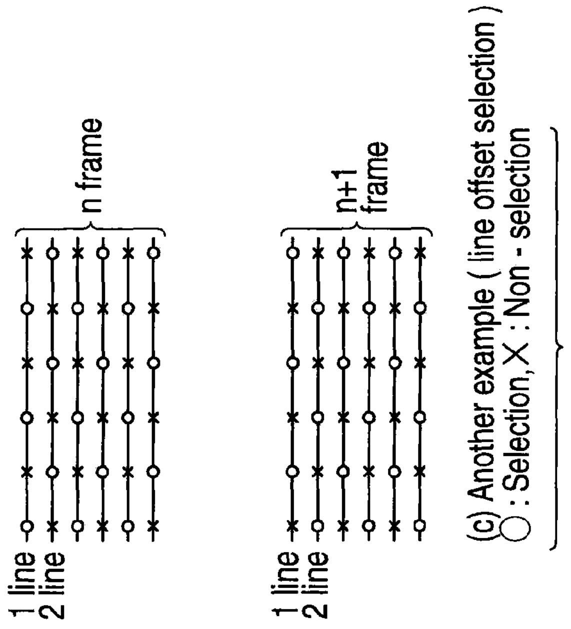
FIGS. 6A to 6C are views to explain various examples of the drive mode of the device shown in FIG. 1.
Figure 6B:
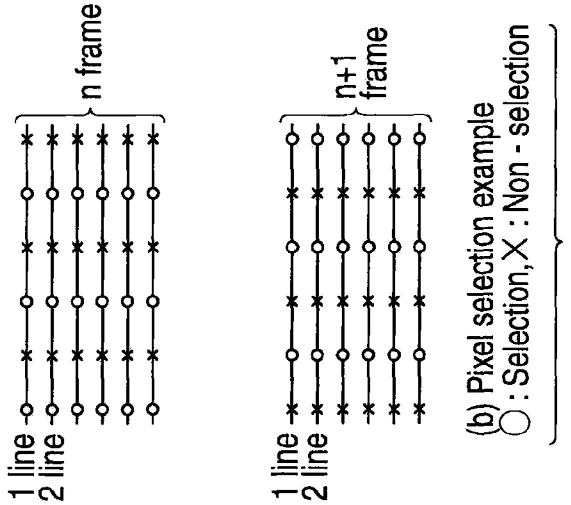
Figure 6A:
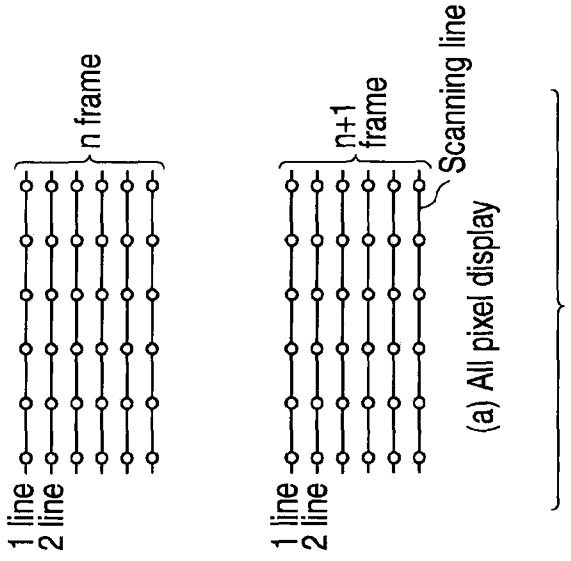

FIG. 6 shows examples of selecting display pixels on the display area 301. FIG. 6A is an example in which the display pixel is all selected every one horizontal line, and the pixel signal is written to each display pixel, as described in FIG. 4. FIG. 6B is an example in which (½) of the display pixel every one horizontal line is selected, and the selected pixel is changed every frame as described in FIG. 5. According to this drive method, power saving is achieved without reducing the image quality.

FIG. 6C is a modification example of the example shown in FIG. 6B. According to the modification example, (½) of the display pixel every one horizontal line is selected; however, selected pixels are different between neighboring horizontal lines. Even if the foregoing display pixel selection processing is carried out, according to the drive method of the present invention, pixel strain and quality reduction of the image quality can be prevented.

Figure 7:
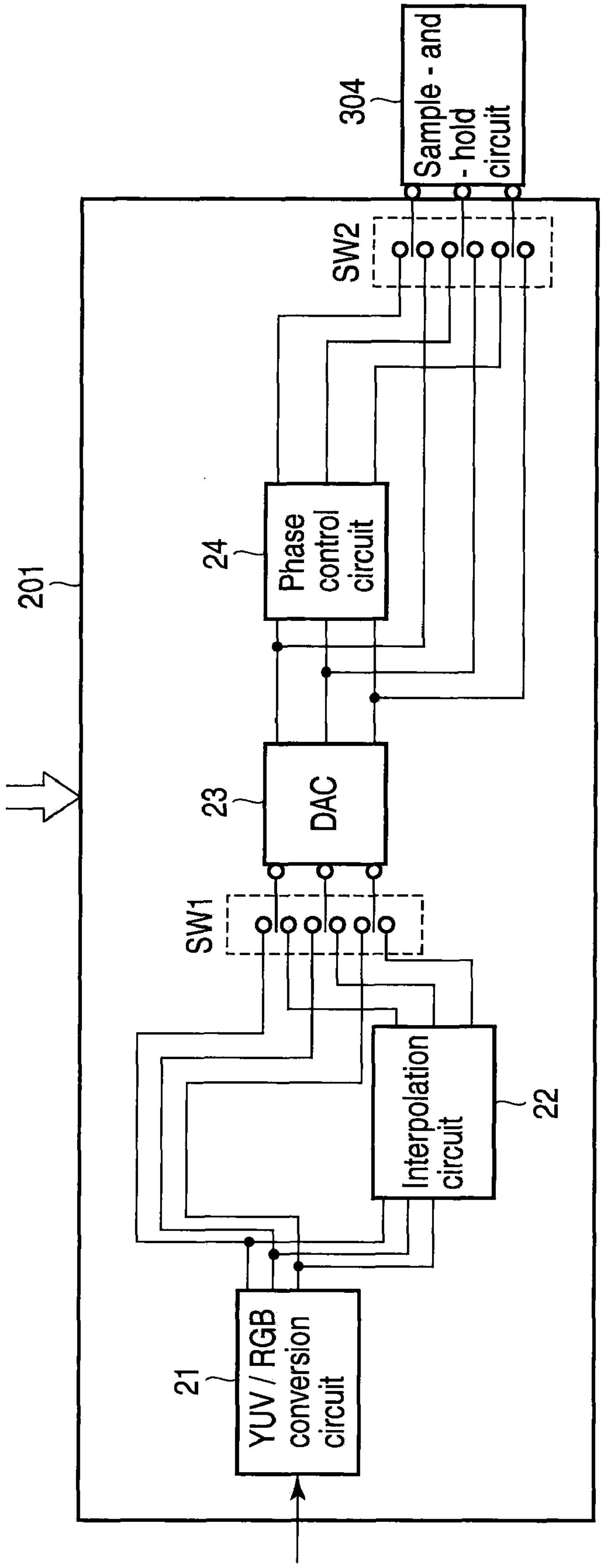
FIG. 7 is a block diagram showing another configuration of a signal processing circuit of FIG. 1.

FIG. 7 shows the configuration of another embodiment o the signal processor 201. The same reference numbers are used to designate components identical to FIG. 1. A DAC 23 selectively selects the output from an interpolation circuit 22 or a YUV/RGB conversion circuit 21 via a switch SW1. In addition, a switch SW2 may be provided so that the output from the DAC 23 is directly input to a sample-and-hold circuit 304. According to the foregoing configuration, the DAC 23 directly selects the output from the YUV/RGB conversion circuit 21, and in this state, switch SW2 supplies the output from a phase control circuit 24 to the sample-and-hold circuit 304.

In this case, the foregoing switches SW1 and SW2 may be fixed after the device is manufactured. The signal processor 201 may be changed to an arbitrary state according to a control signal from a controller or operator (not shown).

Switch SW1 supplies the output from the interpolation circuit 22, and in this state, switch SW2 directly selects the output from the DAC 23.

In order to further clarify the improvement of the device of the present invention, the case where the processing described in FIGS. 2 and 3 is not carried out will be described below.

Figure 8:
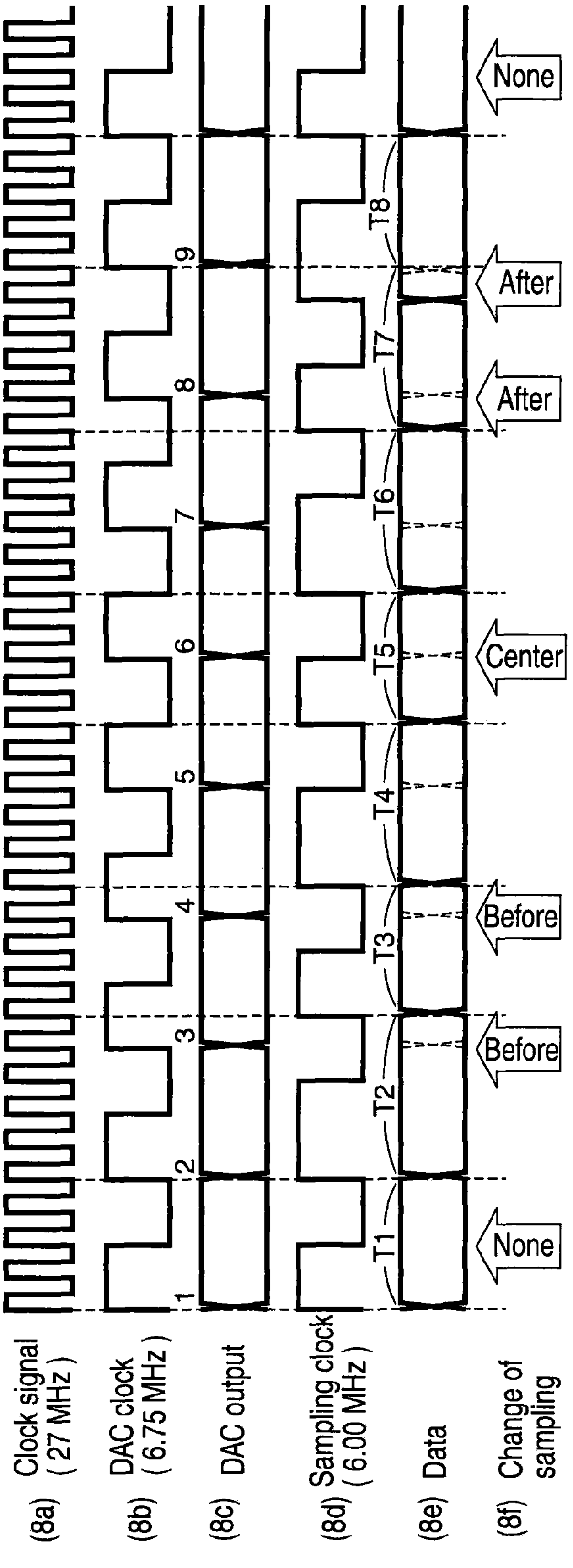
FIG. 8 is a timing chart showing a digital/analog conversion operation when the interpolation operation explained in FIG. 2 is not carried out.
Figure 9:
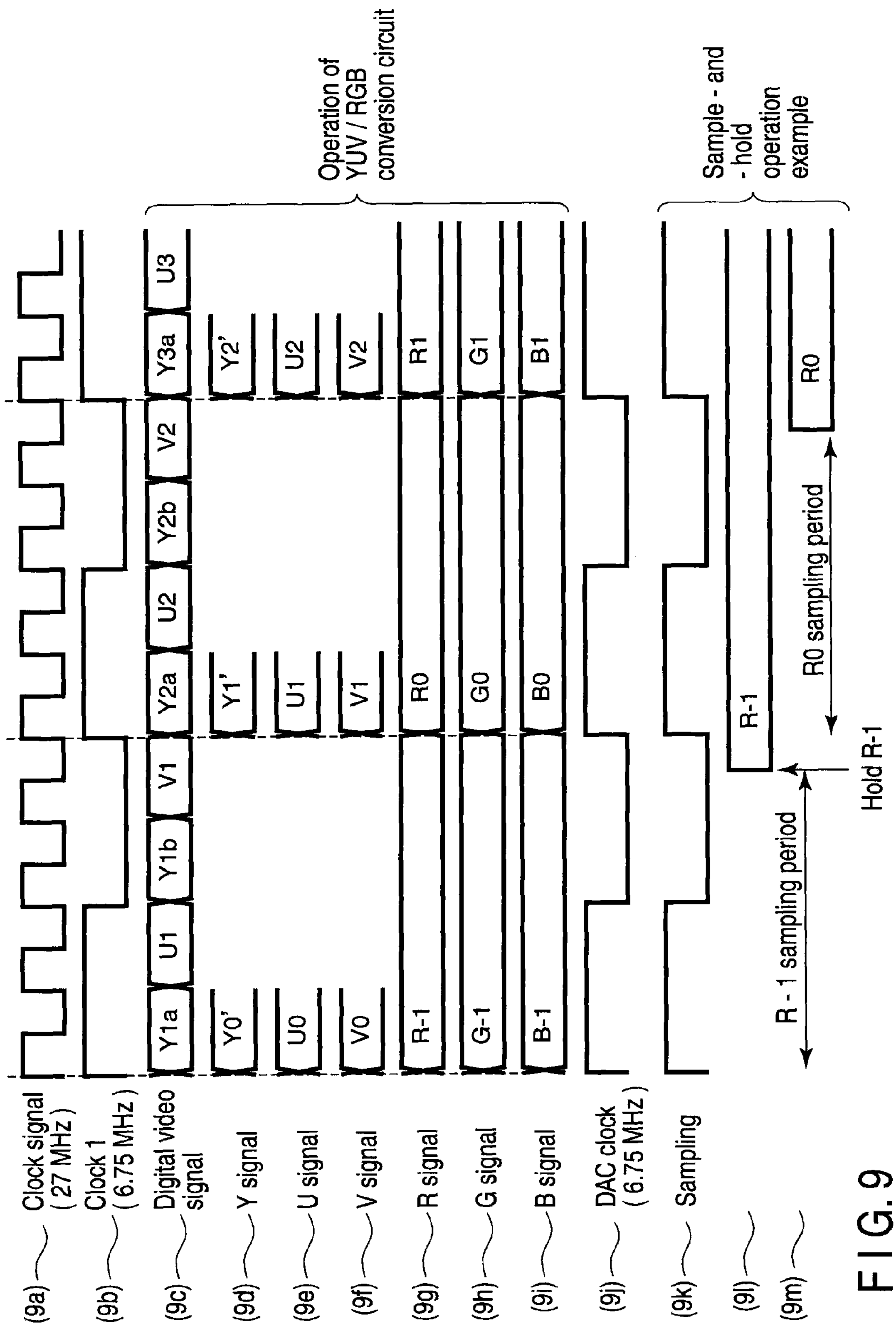
FIG. 9 is a timing chart to explain a sample-and-hold operation of an analog pixel signal and a factor of causing a strain when the interpolation operation explained in FIG. 2 is not carried out.

FIGS. 8 and 9 show the relationship between a change point of the pixel signal output from the digital-to-analog converter and a sampling point in the source driver.

FIGS. 8 and 9 show a signal when a signal is supplied to the display unit without carrying out an interpolation processing in the signal processor. As shown in FIG. 8, a symbol (8*a*) position signal is a first frequency clock, and a symbol (8*b*) position signal is a second frequency clock. A symbol (8*c*) position signal is a DAC analog output, and a symbol (8*d*) position signal is a sampling clock in the source driver. A symbol (8*e*) position shows data to the sample-and-hold circuit. As seen from a symbol (8*e*) position, a change point of pixel data with respect to the sampling point does not shift in period T1. In a period T2, the change point of the pixel signal (change point between pixel signals 2 and 3) exists before transfer to period T3. In period T3, the change point of the pixel signal (change point between pixel signals 3 and 4) exists before transfer to period T4. In period T5, the change point of the pixel signal (change point between pixel signals 5 and 6) exists on the center of period T5. In periods T7 and T8, the change points of the pixel signal each exist after transfer to periods T7 and T8.

In FIG. 9, a symbol (9*a*) position signal is a first frequency clock, and a symbol (9*b*) position signal is a second frequency clock, that is, DAC clock. A symbol (9*c*) position signal is a series YUV digital video signal; specifically, a YUV digital signal in which symbol (9*d*), (9*e*) and (9*f*) position signals are made parallel. Symbol (9*g*), (9*h*) and (9*i*) position signals are RGB signals generated from the YUV digital video signal. The signal is output according to the DAC clock as shown in a symbol (9*j*) position. The sample-and-hold circuit samples the analog output signal according to the second frequency sampling clock. A symbol (9*k*) position signal is a sampling clock, and symbol (9*l*) and (9*m*) position signals are a sample of the R signal.

As described above, the interpolation processing is not carried out, and thereby, the following problem arises. Specifically, in the sample-and-hold circuit 304, the time interval between the sampling point and the change point of the pixel data is short or long; therefore, the variation width is large. In addition, a frequency giving the foregoing variation is close to the sampling frequency of the pixel signal. This is a factor of giving a bad influence to the analog pixel signal held in the sample-and-hold circuit 304.

Thus, in order to solve the foregoing problem, according to the present invention, the interpolation processing described in FIGS. 1 to 3 is carried out. Namely, if phase shift exists between the change point of the pixel signal and the sampling point, the analog pixel signal contains a high-frequency component easily attenuated. However, the influence is considerably reduced as compared with the bad influence shown in FIGS. 8 and 9. In other words, the reduction of image quality can be prevented.

Figure 10:
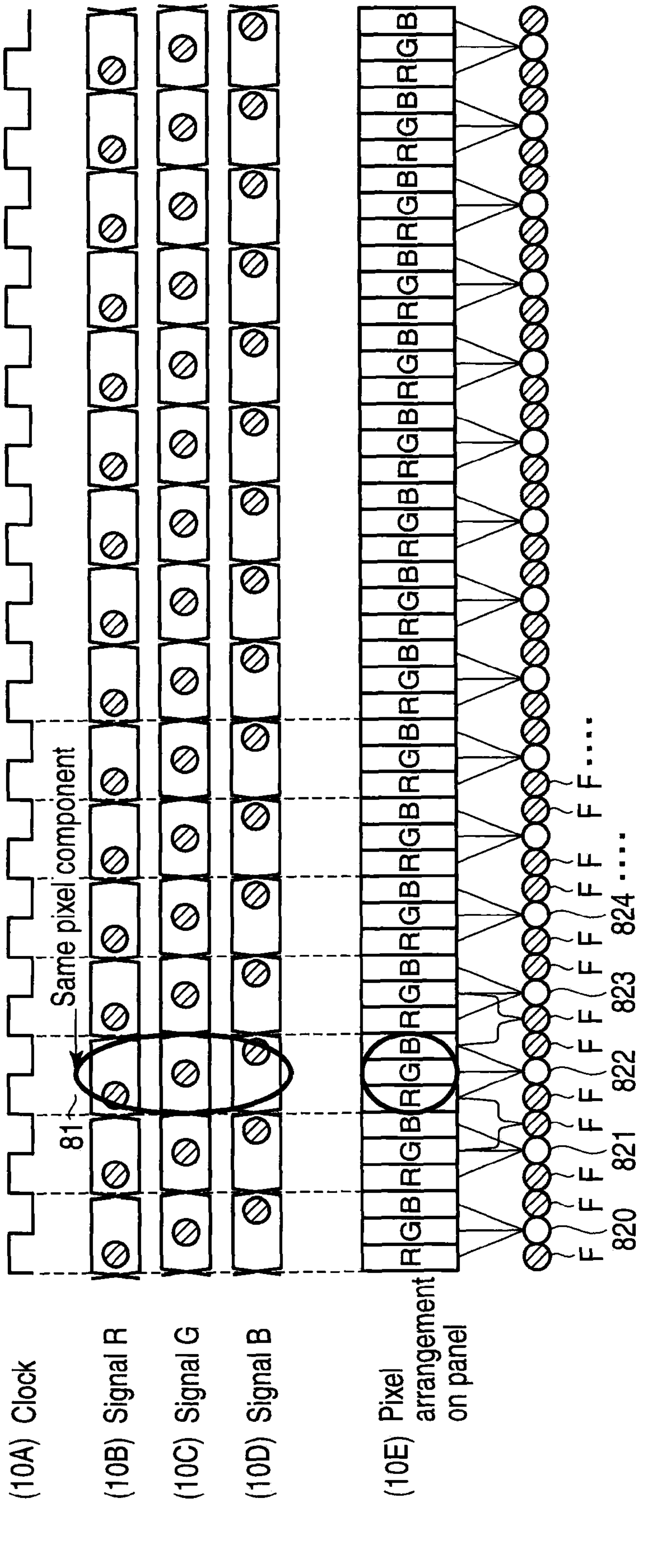
FIG. 10 is a view showing a RGB pixel signal phase and sample-and-hold timing when the phase control explained in FIG. 4 is not carried out.
Figure 11:
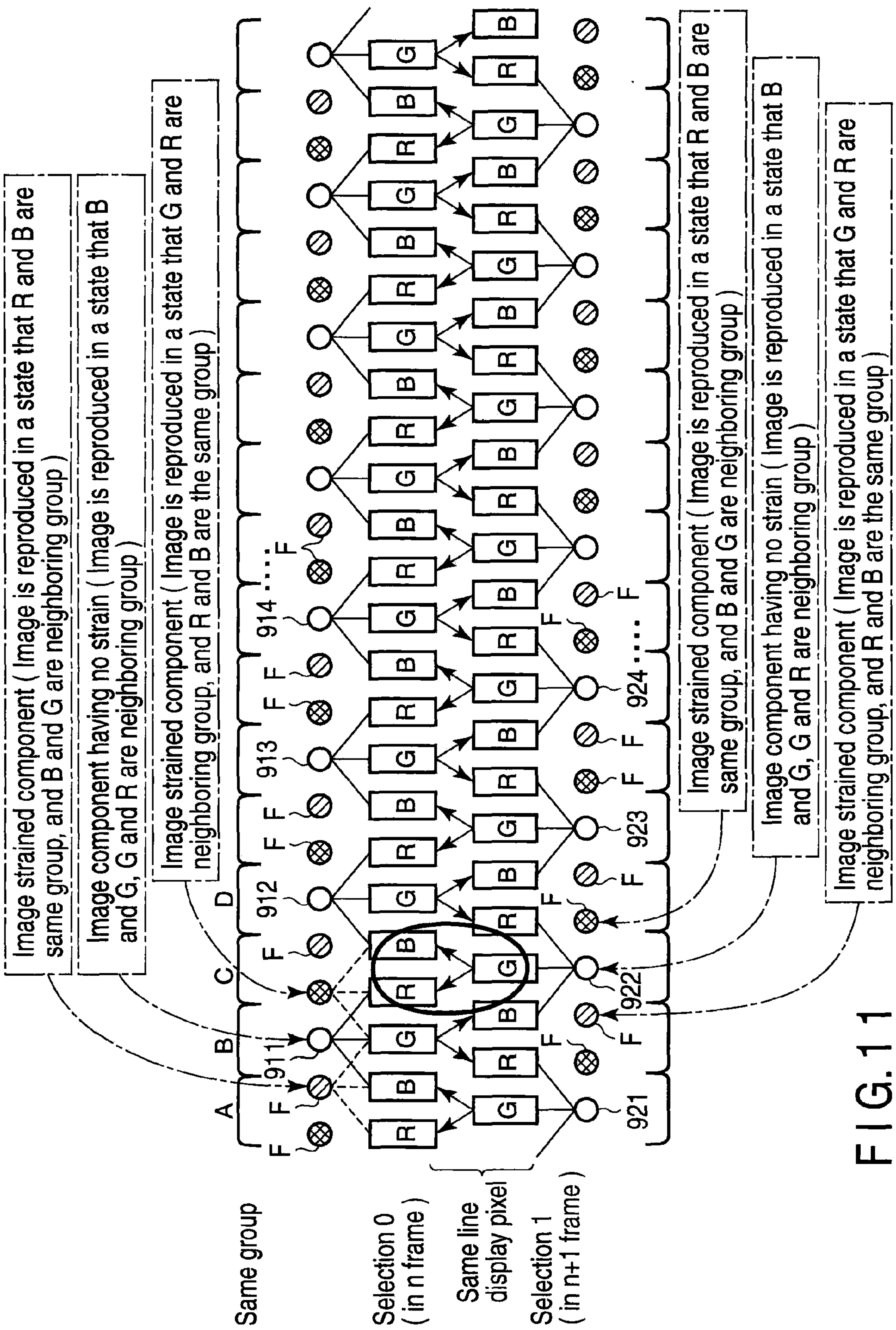
FIG. 11 is a view to explain a factor of generating a strain by employing a two-frame cyclic-type drive method when the phase control explained in FIG. 4 is not carried out.

The case where the processing described in FIGS. 4 and 5 is not carried out will be described below with reference to FIGS. 10 and 11. In FIG. 10, a symbol (10A) position signal is a sampling clock of a pixel signal, and RGB pixel signals (see symbol (10B), (10C) and 10D positions) have the same phase. Therefore, three proper pixel signals corresponding to one color image is a RGB pixel signal (e.g., surrounded by a circle 81) having the same phase. The RGB pixel signals are supplied to the corresponding RGB pixels (see symbol (10E) position), and thereby, proper color image display 821 is obtained. Color image displays 820, 821, 822, 823, . . . .

However, the sampling phase is not necessarily proper. In such a case, the signal has a strain, or color image displays having reduced quality F . . . are obtained.

According to the sampling method, even if the two-frame cyclic type drive is carried out, the signal has a strain, and color image displays having reduced quality are obtained. FIG. 11 shows a pixel arrangement on a panel when the two-frame cyclic type drive is carried out. When stable color image displays 911, 912, 913, 914, . . . , 921, 922, 923, 924, . . . are obtained, the quality is high without strain. However, when the sampling phase shifts, a color image display F having strain is obtained. Even if display pixel selection shown in symbols (6*b*) and (6*c*) in FIG. 6 is made, a color image display F having strain occurs.

According to the foregoing embodiment, low power consumption is achieved. In addition, even if the sample-and-hold circuit samples the signal supplied from the signal processor to the display unit, image quality reduction is hard to occur. Further, it is possible to reduce a drive load and power consumption.

The invention is not limited to the foregoing embodiment. Constituent components are changed and embodied without departing from the subject matter in the inventive step. A plurality of constituent components disclosed in the foregoing embodiment is properly combined, and thereby, various inventions are formed. For example, some constituent component may be deleted from all constituent components disclosed in the foregoing embodiment. Constituent components in different embodiment may be properly combined.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A flat-panel display device comprising:

a phase control circuit setting a state that a first parallel arrangement RGB pixel signal shifts by 120 degrees;

a sample-and-hold circuit sampling a second parallel arrangement RGB pixel signal parallel-output from the phase control circuit to obtain a series arrangement RGB pixel signal, which is three times as much as a single pixel signal; and a driver supplying the series arrangement RGB pixel signal to the corresponding display pixel, the driver setting some pairs of RG pixel signal, BR pixel signal, GB pixel signal, RG pixel signal, BR pixel signal, GB pixel signal, . . . when supplying the series arrangement RGB pixel signal to the corresponding display pixel, and supplying one pixel signal of each pair to the corresponding display pixel in an n (n being an integer) frame while supplying the other pixel signal of each pair to the corresponding display pixel in a (n+1) frame.

2. The device according to claim 1, wherein the display area driver supplies the series arrangement RGB pixel signal to the corresponding display pixel, the driver setting some pairs of RG pixel signal, BR pixel signal, GB pixel signal, RG pixel signal, BR pixel signal, GB pixel signal, . . . when supplying the series arrangement RGB pixel signal to the corresponding display pixel, and supplies one pixel signal of each pair to the corresponding display pixel in an n frame while supplies the other pixel signal of each pair to the corresponding display pixel in a (n+1) frame, One and the other pixel signals are selected so that the pixel signal shifts in a horizontal direction between vertical and horizontal lines in the same frame.

3. The device according to claim 1, wherein the phase control circuit sets a state that an output of a digital-to-analog converter, that is, first parallel arrangement RGB pixel signal shifts by 120 degrees in its phase.

4. The device according to claim 1, wherein the phase control circuit sets a state that a digital signal, that is, parallel arrangement RGB pixel signal shifts by 120 degrees, and supplies the signal to an analog-to-digital converter.

5. The device according to claim 1, further comprising:

a conversion circuit separating and parallelizing a digital video signal having YUV components series-sent at a first frequency (f) clock every component to obtain a parallel data stream having a second frequency (f/N) clock, and carrying out an operation using the parallel data stream to generate a parallelized first intermediate parallel RGB signal;

an interpolation circuit arranging a second intermediate parallel RGB signal having the same content neighboring the first intermediate parallel RGB signal in its time axis, and arranging front and read parallel RGB signals generated by an interpolation processing in the time axis of the first and second intermediate parallel RGB signals, and further, outputting the front parallel RGB signal, first, second intermediate parallel RGB signals and the rear parallel RGB signal; and a digital-to-analog converter converting the front parallel RGB signal, first, second intermediate parallel RGB signals and the rear parallel RGB signal to an analog signal every R series, G series and B series, and outputting the output at the first frequency (f), the output from the digital-to-analog converter being input to the phase control circuit.

6. The device according to claim 5, wherein the sample-and-hold circuit samples and holds the front parallel RGB signal, first, second intermediate parallel RGB signals and the rear parallel RGB signal, which are output from the phase control circuit and supplied at the first frequency (f) according to a third frequency (f/N2) for converting the number of pixels.

7. The device according to claim 5, further comprising: a first switch; the first switch directly supplying an output signal from the conversion circuit or an output signal of the interpolation circuit to the digital-to-analog converter.

8. The device according to claim 7, further comprising: a second switch; the second switch directly supplying an output signal from the digital-to-analog converter or an output signal of the phase control circuit to the sample-and-hold circuit.

* * * * *